(12) United States Patent
Takase

(10) Patent No.: US 6,977,188 B2
(45) Date of Patent: Dec. 20, 2005

(54) RESIN ENCAPSULATION MOLDING METHOD OF ELECTRONIC PART AND RESIN ENCAPSULATION MOLDING APPARATUS USED THEREFOR

(75) Inventor: Shinji Takase, Kyoto (JP)

(73) Assignee: Towa Corporation, Kyoto (JP)

( * ) Notice: Subject to any disclaimer, the term of this patent is extended or adjusted under 35 U.S.C. 154(b) by 81 days.

(21) Appl. No.: 10/641,606

(22) Filed: Aug. 15, 2003

(65) Prior Publication Data

US 2004/0048416 A1   Mar. 11, 2004

(30) Foreign Application Priority Data

Sep. 6, 2002   (JP) .............................. 2002-260894

(51) Int. Cl.⁷ ............................................. H01L 21/44
(52) U.S. Cl. ..................................................... 438/106
(58) Field of Search ........................................ 438/106

(56) References Cited

U.S. PATENT DOCUMENTS 6,471,501 B1   10/2002   Shinma et al.

FOREIGN PATENT DOCUMENTS

| EP | 1189270 | 3/2002 |
|---|---|---|
| JP | 11274192 | 10/1999 |
| TW | 400586 | 8/2000 |

*Primary Examiner*—David S. Blum
(74) *Attorney, Agent, or Firm*—W. F. Fasse; W. G. Fasse

(57) ABSTRACT

First, an intermediate plate and a lower mold are clamped. Thus, a release film is sandwiched between a mold surface of the intermediate plate and a mold surface of the lower mold. In this state, the clamping of an upper mold and the intermediate plate begins. Thus, an enclosed space is formed. Thereafter, the enclosed space is forcibly evacuated. At this time, the upper mold and the intermediate plate is gradually clamped. As a result, the enclosed space is filled with a molten resin and the resin encapsulation mold is completed. According to this method, the release film is prevented from moving into the enclosed space. Thus, deformation or severing of a wire is avoided when the resin encapsulation molding is performed.

9 Claims, 8 Drawing Sheets

RESIN ENCAPSULATION MOLDING METHOD OF ELECTRONIC PART AND RESIN ENCAPSULATION MOLDING APPARATUS USED THEREFOR

BACKGROUND OF THE INVENTION

1. Field of the Invention

The present invention relates to a resin encapsulation molding method of an electronic part, in which a vacuum mechanism and a release film are used in combination when providing resin encapsulation molding to a substrate to which the electronic part is mounted, and a resin encapsulation apparatus used therefor.

2. Description of the Background Art

Conventionally, resin encapsulation molding has been provided to a semiconductor chip attached to a substrate. In the resin encapsulation molding, a resin encapsulation molding apparatus is used that includes a mold and a release film for providing the resin encapsulation molding to an electronic part. A conventional resin encapsulation molding apparatus is provided with, for example as shown in FIG. 8, a mold consisting of an upper mold 31 and a lower mold 32. Further, the resin encapsulation molding apparatus is provided with a release film supplying mechanism (not shown) for providing a release film 34 between upper mold 31 and lower mold 32, applying a prescribed tension to release film 34.

The resin encapsulation molding apparatus is further provided with a seal member 42 for making the inside of the mold to an outer air blocking space 41 before the mold is clamped. Further, the resin encapsulation molding apparatus is provided with a vacuum mechanism (not shown) for evacuating outer air blocking space 41.

Using the resin encapsulation molding apparatus, a substrate 36 is provided with resin encapsulation molding. Substrate 36 is provided with a semiconductor chip (an electronic part) 37 and a wire 38 that electrically connects substrate 36 and chip 37. Further, as shown in FIG. 8, a cavity 35 is provided to a mold surface 33 of lower mold 32. Cavity 35 is filled with a molten resin. At this time, chip 37 and wire 38 are commonly provided with resin encapsulation molding.

Further, for example as shown in FIG. 8, a suction port 40 communicating with a mechanism for suctioning a release film (not shown) is provided to the bottom surface of cavity 35 of lower mold 32. By the function of this mechanism for suctioning the release film, release film 34 covers cavity 35 of lower 32 conforming to the contour thereof, with a prescribed tension.

Still further, fixing means 39 are provided to mold surface 33 of upper mold 31 for fixing the position of substrate 36. As shown in FIG. 8, substrate 36 can be fixed to upper mold 31, with semiconductor chip 37 and wire 38 facing downward.

Still further, before clamping upper mold 31 and lower mold 32, as shown in FIG. 8, release film 34 is suctioned to cavity 35 of lower mold 32. At this time, seal member 42 provided to mold surface 33 of upper mold 31 serves to form outer air blocking space 41. In this state, by the function of the vacuum mechanism, outer air blocking space 41 is forcibly evacuated through air vacuum hole 43.

More specifically, the conventional resin encapsulation molding method is as follows.

First, upper mold 31 and lower mold 32 are mold-open (unclamped). Then, the main surface of substrate 36 to which semiconductor chip 37 and wire 38 are attached is faced downward. In this state, fixing means 39 are activated to attach substrate 36 to mold surface 33 of upper mold 31. Additionally, release film 34 with a prescribed tension covers along the surface of cavity 34 of lower mold 32. This is performed by evacuating air from the mold through release film suction port 40. Subsequently, before upper mold 31 and lower mold 32 are clamped, the function of seal member 42 is used to form outer air blocking space 41 by release film 34 covering along the surface of cavity 35 of lower mold 32 and upper mold 31.

Then, as shown in FIG. 8, outer air blocking space 41 is evacuated through air vacuum hole 43 by the function of the vacuum mechanism. Then, in the state performing the evacuation of the mold, upper mold 31 and lower mold 32 are completely clamped. Next, cavity 35 covered by release film 34 is filled with a molten resin. Thus, the molten resin covers semiconductor chip 37 and wire 38 mounted on substrate 36. Thereafter, the molten resin cures. As a result, an encapsulated substrate, in which the cured resin is formed on substrate 36, is formed.

However, in the conventional resin encapsulation molding apparatus, there is a difference in the magnitude between a suction force A and a suction force B shown in FIG. 8. Suction force A is for evacuating through suction hole 40. In other words, suction force A is for causing release film 34 to cover mold surface 33 of lower mold 32 and the contour of cavity 35. Further, suction force B is for evacuating through air vacuum hole 43. In other words, suction force B is for forming outer air blocking space 41 between release film 34 and upper mold 31 using seal member 42 provided on mold surface 33 of upper mold 31.

In the conventional resin encapsulation molding apparatus, the difference between two suction forces A and B adversely affects the resin encapsulation molding. Consider a case in which suction force B is greater than suction force A. In this case, the air in the space of cavity 35 is suctioned. Therefore, as shown in FIG. 8, release film 34 covering along the contour of cavity 35 indicated by a dash-dot-dot line moves to the space in cavity 35 become wavy release film 34 indicated by a solid line. Thus, there arises a problem that release film 34 contacts the wire 38 in the space of cavity 35.

Upper mold 31 and lower mold 32 are clamped with release film 34 waved in the space of cavity 35 as shown in FIG. 8. At this time, a problem arises that wire 38 attached to substrate 36 (semiconductor chip 37 and wire 38) is deformed or severed.

SUMMARY OF THE INVENTION

The present invention is made considering the problems above, and an object of the present invention is to provide a resin encapsulation molding method in which deformation of an electronic part is prevented, and a resin encapsulation molding apparatus using the method.

The resin encapsulation molding method is performed as follows.

First, three preparation steps are executed. A first mold having one main mold surface is prepared. A second mold having other main mold surface opposing to the one main mold surface is prepared. A third mold that forms a mold side surface between the one main mold surface and the other main mold surface is prepared.

Next, an electronic part is fitted into the first mold. Thereafter, a release film is sandwiched using the second mold and the third mold. Thus, a prescribed tension is applied to the release film and the release film closely contacts the other main mold surface. Then, clamping of the first mold, the second mold and the third mold is executed. Thus, an enclosed space that includes the electronic part by using the one main mold surface, the other main mold surface and the mold side surface is formed. Thereafter, the enclosed space is filled with a molten resin. In this state, the molten resin cures and the electronic part is provided with resin encapsulation molding.

According to the method above, the resin encapsulation molding can be performed in a state where the release film closely contacts to the other main mold surface. Accordingly, the release film is prevented from moving into the enclosed space when the enclosed space is evacuated, in a state where the first, second and third molds are clamped. As a result, deformation of the electronic part is avoided.

Further, the step of clamping may include steps of clamping the third mold and the second mold, and clamping the first mold and the third mold.

Still further, the step of closely contacting the release film to the other main mold surface may be executed before the step of clamping the first mold and the third mold.

According to the method, since the release film does not move into the enclosed space when the first and the third molds are clamped, it is ensured to avoid the contact of the electronic part and the release film.

A resin encapsulation molding apparatus has the structure used in the resin encapsulation molding method. Further, it is preferable that the resin encapsulation molding apparatus further includes a resilient mechanism for pressing the release film to the third mold when applying a prescribed tension to the release film. By this structure, the prescribed tension can easily be applied to the release film.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
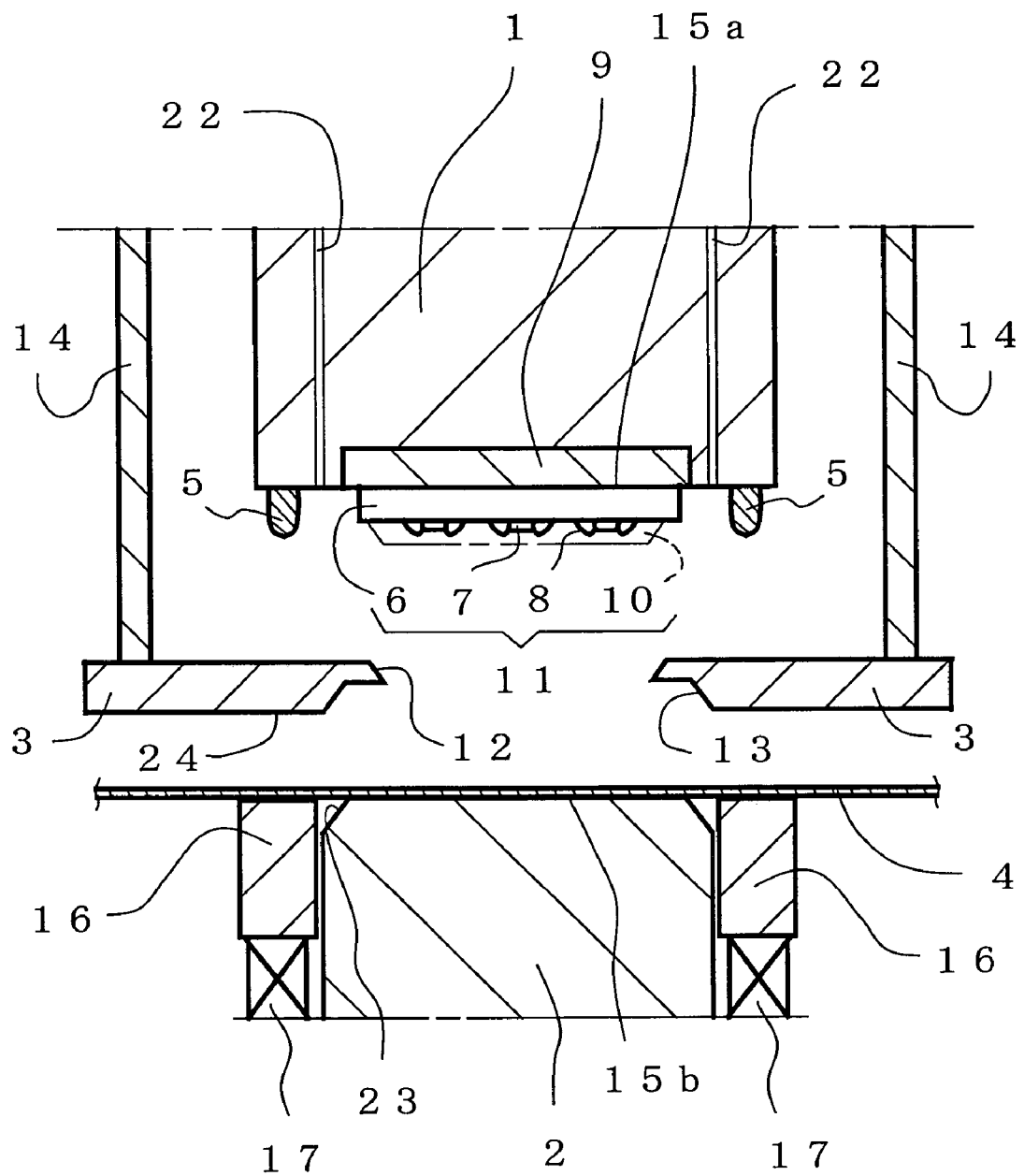
FIG. 1 is a cross-sectional view showing enlarged main part of a resin encapsulation molding apparatus of an electronic apparatus of an embodiment, in which an upper mold, a lower mold and an intermediate plate are mold-open.
Figure 2:
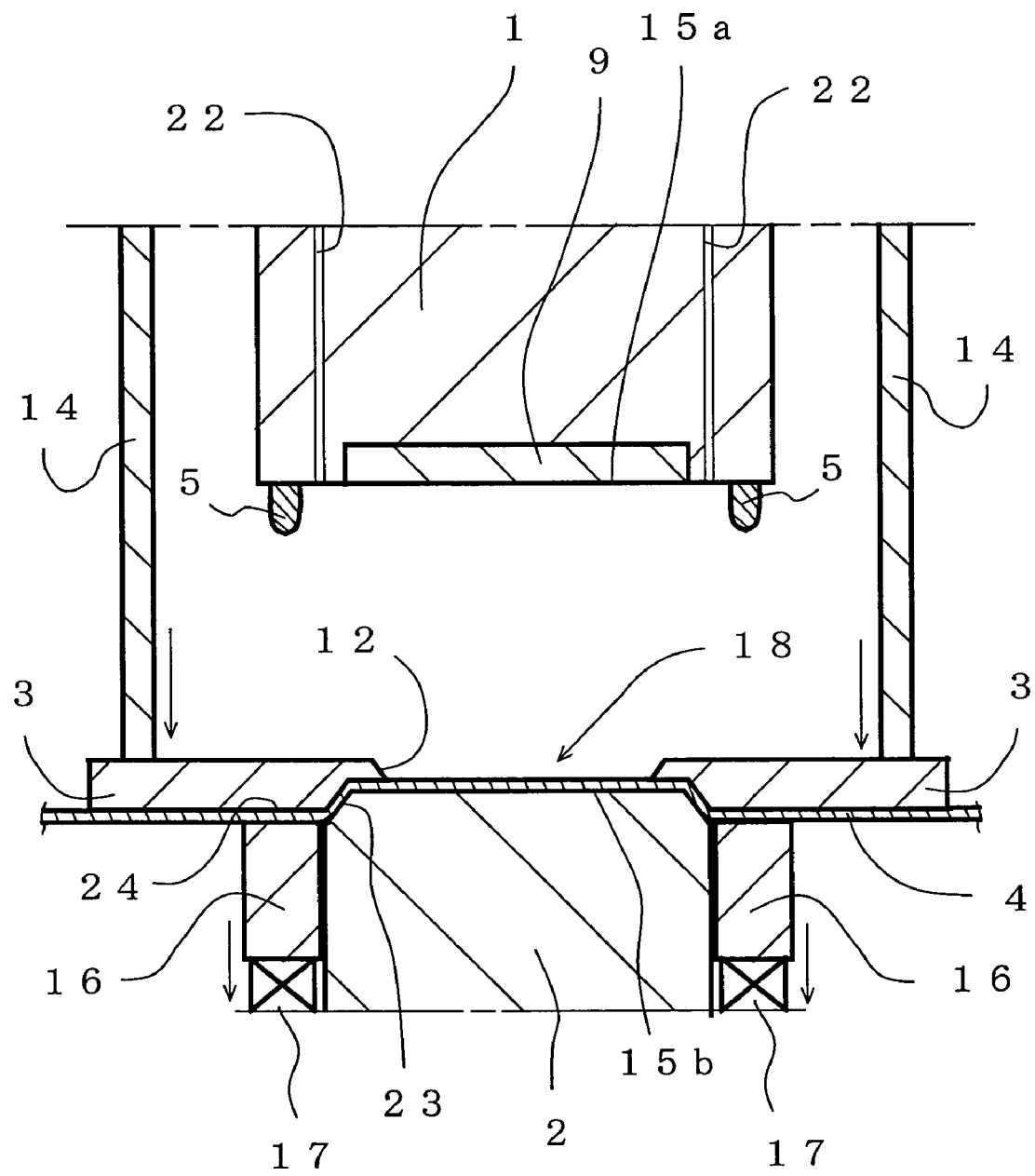
FIG. 2 is a cross-sectional view showing enlarged main part of the resin encapsulation molding apparatus of an electronic apparatus of the embodiment, in which the lower mold and the intermediate plate are clamped.

Referring to FIGS. 1–5, each step of a resin encapsulation molding method according to an embodiment is described. A resin encapsulation molding apparatus includes, as shown in FIGS. 1 and 2, a mold including an upper mold 1, a lower mold 2 arranged facing to upper mold 1, and an intermediate plate 3 provided between upper mold 1 and lower mold 2. Further, the resin encapsulation apparatus is provided with a release film supplying mechanism (not shown) for supplying a release film 4 for covering a mold surface 15*b* of lower mold 2 between lower mold 2 and intermediate plate 3.

Figure 3:
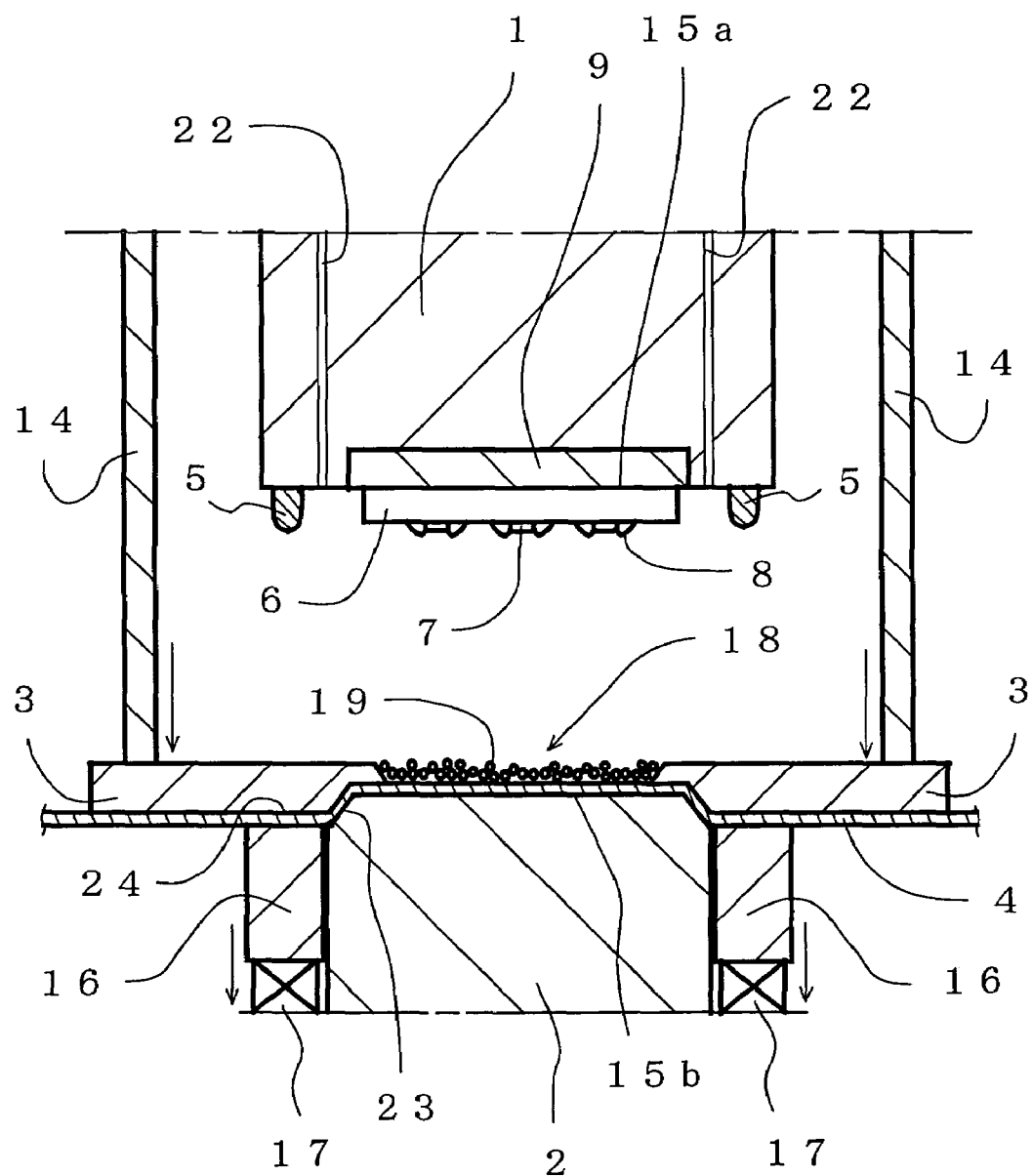
FIG. 3 is a cross-sectional view showing enlarged main part of the resin encapsulation molding apparatus of an electronic apparatus of the embodiment, in which a substrate is attached to a mold and a granulated resin is placed on a release film.

As shown in FIG. 3, lower mold 2 and intermediate plate 3 are clamped and thus release film 4 is sandwiched between them. In this state, a resin material of a required amount is supplied to a cavity space 18 that is formed by mold surface 12 of intermediate plate 3 and mold surface 15*b* of lower mold 2 covered by release film 4. This supply of resin is performed by the resin material supplying mechanism (not shown).

Figure 4:
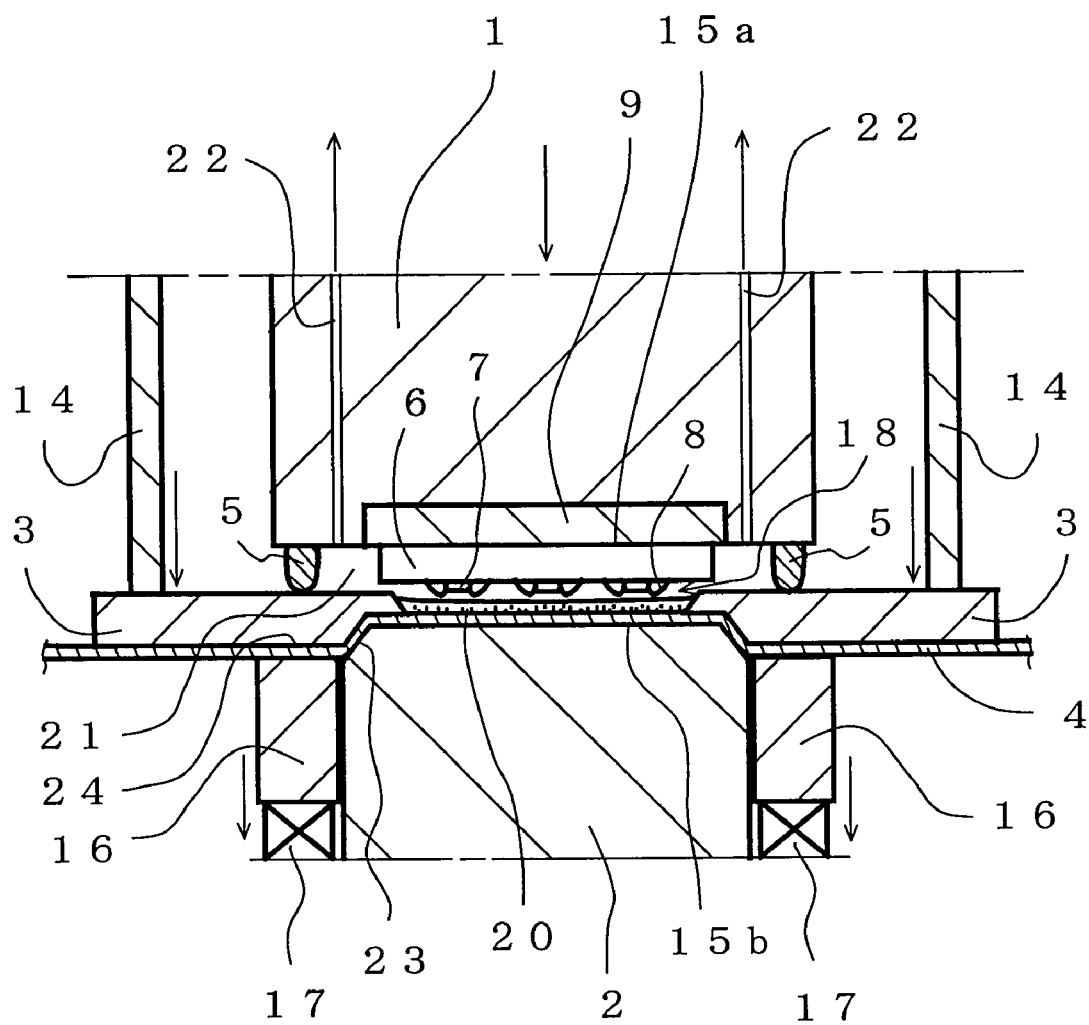
FIG. 4 is a cross-sectional view showing enlarged main part of the resin encapsulation molding apparatus of an electronic apparatus of the embodiment, in a state of an intermediate clamping (before a full clamped state shown in FIG. 5) in which the lower mold and the intermediate plate are clamped and the upper mold and the intermediate plate are joined and vacuum is produced inside the mold.

As shown in FIG. 4, the mold is provided with a seal member 5 at the mold surface of upper mold 1 for forming an enclosed space 21 that separates cavity space 18 and outer air. Resin encapsulation forming apparatus is provided with a vacuum mechanism for forcibly evacuating enclosed space 21.

The electronic part is provided with a semiconductor chip 7 die-bonded on a substrate 6 and a wire 8 electrically connecting substrate 6 and semiconductor chip 7. Upper mold 1 is provided with fixing means 9 for fixing substrate 6 to which the electronic part (semiconductor chip 7) and wire 8 are attached. Fixing means 9 fix substrate 6 to a mold surface 15*a* in a state in which semiconductor chip 7 and wire 8 are facing downward, as shown in FIG. 1.

In FIG. 1, fixing means 9 are shown as arranged parallel to substrate 6. However, the arrangement of fixing means 9 is not limited to the arrangement shown in FIG. 1. Fixing means 9 may be, for example, a recess for setting (not shown) by which substrate 6 is set to mold surface 15*a* of upper mold 1.

Thus, substrate 6 is fixed to mold surface 15*a* with semiconductor chip 7 and wire 8 facing downward. Then, semiconductor chip 7 and wire 8 are provided with resin encapsulation molding by a molten resin. Thereafter, the molten resin is cured to form a cured resin 10. As a result, the encapsulated substrate 11 is formed.

As shown in FIG. 1, intermediate plate 3 has mold surface 12 that forms a cavity arranged through intermediate plate 3 and to which semiconductor chip 7 attached to substrate 11 and wire 8 are fitted. Further, intermediate plate 3 has a slope surface 13 for clamping upper mold 1 and lower mold 2. Still further, intermediate plate 3 has a mold surface 24 for pressing release film 4. Intermediate plate 3 moves upward and downward by upward and downward movement of a support member 14 that supports intermediate plate 3.

As shown in FIG. 1, lower mold 2 is provided with mold surface 15b that is horizontal and joins to the bottom of mold surface 12 of intermediate plate 3. To the periphery of lower mold 2, a member 16 that joins to mold surface 24 for sandwiching release film 4 is provided. Mold surface 15b and the upper surface of member 16 are provided approximately at the same plane. Member 16 for sandwiching release film 4 is provided with a resilient member 17 formed with a compression spring or the like. By the compression and expansion of resilient member 17 in the vertical direction, release film 4 is tensioned in the direction of its surface.

Lower mold 2 is provided with a slope surface 23 that joins to slope surface 13 of intermediate plate 3 for tensioning release film 4. Slope surface 23 is arranged to face slope surface 13.

As shown in FIG. 1, release film 4, which is applied with a prescribed tension and held horizontally, is supplied to the mold by the release film supplying mechanism. Thereafter, when intermediate plate 3 and lower mold 2 are clamped, firstly support member 14 that supports intermediate plate 3 moves downward. Thus, release film 4 applied with a prescribed tension and mold surface 24 of intermediate plate 3 contact to each other. Thereafter, release film 4 is sandwiched by mold surface 24 and the upper surface of member 16.

Next, support member 14 further moves downward. Thus, resilient member 17 attached to member 16 is pressed and compresses. Additionally, slope surface 13 of intermediate plate 3 and release film 4 contact to each other. At this time, the release film is pulled along the contour of slope surface 23 of the lower mold. Additionally, slope surface 13 and slope surface 23 join, with release film 4 interposed between them.

Next, support member 14 of intermediate plate 3 further moves downward. Thus, the bottom side of mold surface 12 of intermediate plate 3 and mold surface 15b of lower mold 2 join, with release film 4 interposed between them. Thus, clamping of intermediate plate 3 and lower mold 2 is completed. As a result, as shown in FIG. 2, release film 4 covers mold surface 15b of lower mold 2, in a state being applied with a prescribed tension.

At this time, as shown in FIG. 2, cavity space 18 is formed by mold surface 12 of intermediate plate 3 and mold surface 15b of lower mold 2 covered with release film 4. Note that it is possible to forcibly evacuate cavity space 18 by a vacuum mechanism that is not shown.

Figure 8:
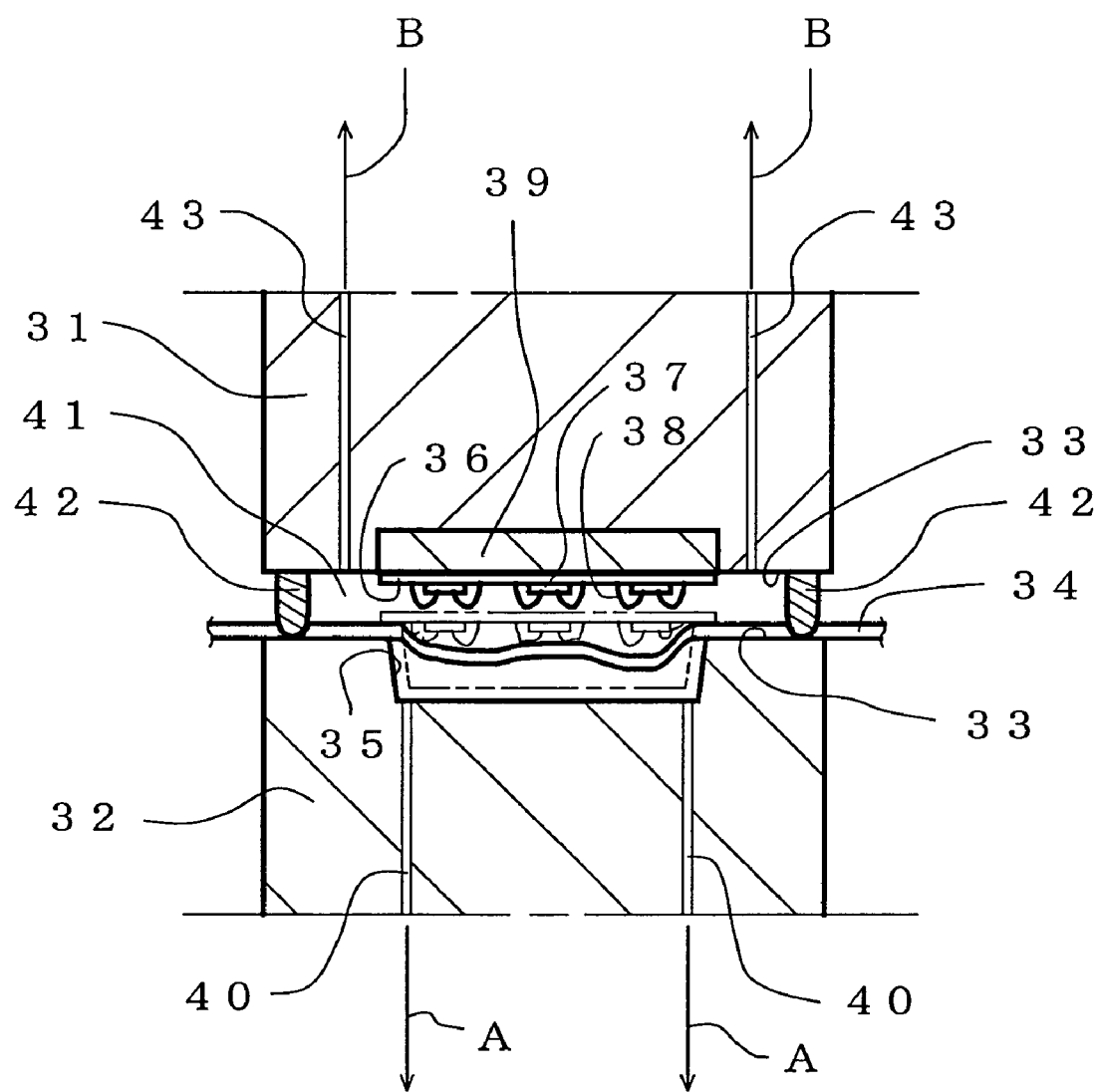
FIG. 8 is a cross-sectional view showing enlarged main part of a conventional resin encapsulation molding apparatus of an electronic apparatus.

According to the resin encapsulation molding method of the present embodiment, the condition of the release film when cavity space 18 (enclosed space 21) is forcibly evacuated is different from that of the conventional resin encapsulation molding method shown in FIG. 8. Specifically, according to the resin encapsulation molding method of the present embodiment, release film 4 is prevented from leaving from mold surface 15b of lower mold 2 by the presence of intermediate plate 3. Thus, it is possible to perform the resin mold in the condition where release film 4 closely contacts to mold surface 15b of lower mold 2. Accordingly, deformation or severing of wire 8 when injecting resin due to the contact of release film 4 and wire 8 can be avoided.

Next, in the state where intermediate plate 3 and lower mold 2 are clamped, as shown in FIG. 3, a granulated resin 19 of a necessary amount is supplied from a resin material supplying mechanism (not shown) into cavity space 18. Next, as shown in FIG. 4, granulated resin 19 of the necessary amount supplied to cavity space 18 is heated and a molten resin 20 is formed. Granulated resin 19 turns to molten resin 20 before upper mold 1 and intermediate plate 3 are clamped.

As means for forming molten resin 20 by heating granulated resin 19, any means may be employed as long as it can heat cavity space 18, such as a heater embedded in the mold or a resin material heating and melting mechanism.

FIG. 4 shows an intermediate (or an initial) clamping state of intermediate plate 3 and lower mold 2, and shows a state before upper mold 1 and intermediate plate 3 are fully clamped. In this state, seal member 5 provided to the mold surface of upper mold 1 contacts the upper surface of intermediate plate 3 to form enclosed space 21. Further, when forcibly evacuating enclosed space 23 using a vacuum mechanism, the air is suctioned from air vacuum hole 22.

At this time, according to the resin encapsulation molding method of the present embodiment, release film 4 is tightly pinched by intermediate plate 3 and both of lower mold 2 and member 16. Therefore, when enclosed space 21 became a vacuum state due to the suction function of the vacuum mechanism, release film 4 is not detached (separated) from upper surface 15 b of lower mold 2.

Seal member 5 provided to upper mold 1 is to render cavity space 18 to enclosed space 21, seal member 5 may not be provided and enclosed space 21 may be formed using the mold. Additionally, seal member 5 is capable of forming enclosed space 21 even when it is provided on the upper mold surface of intermediate plate 3.

When upper mold 1 and intermediate plate 3 are clamped, the upper surface of molten resin 20 supplied into cavity space 18 and wire 8 of the electronic part (semiconductor chip 7) fixed by fixing means 9 of upper mold 1 must be separated. To this end, the size of seal member 5 is adjusted.

Figure 5:
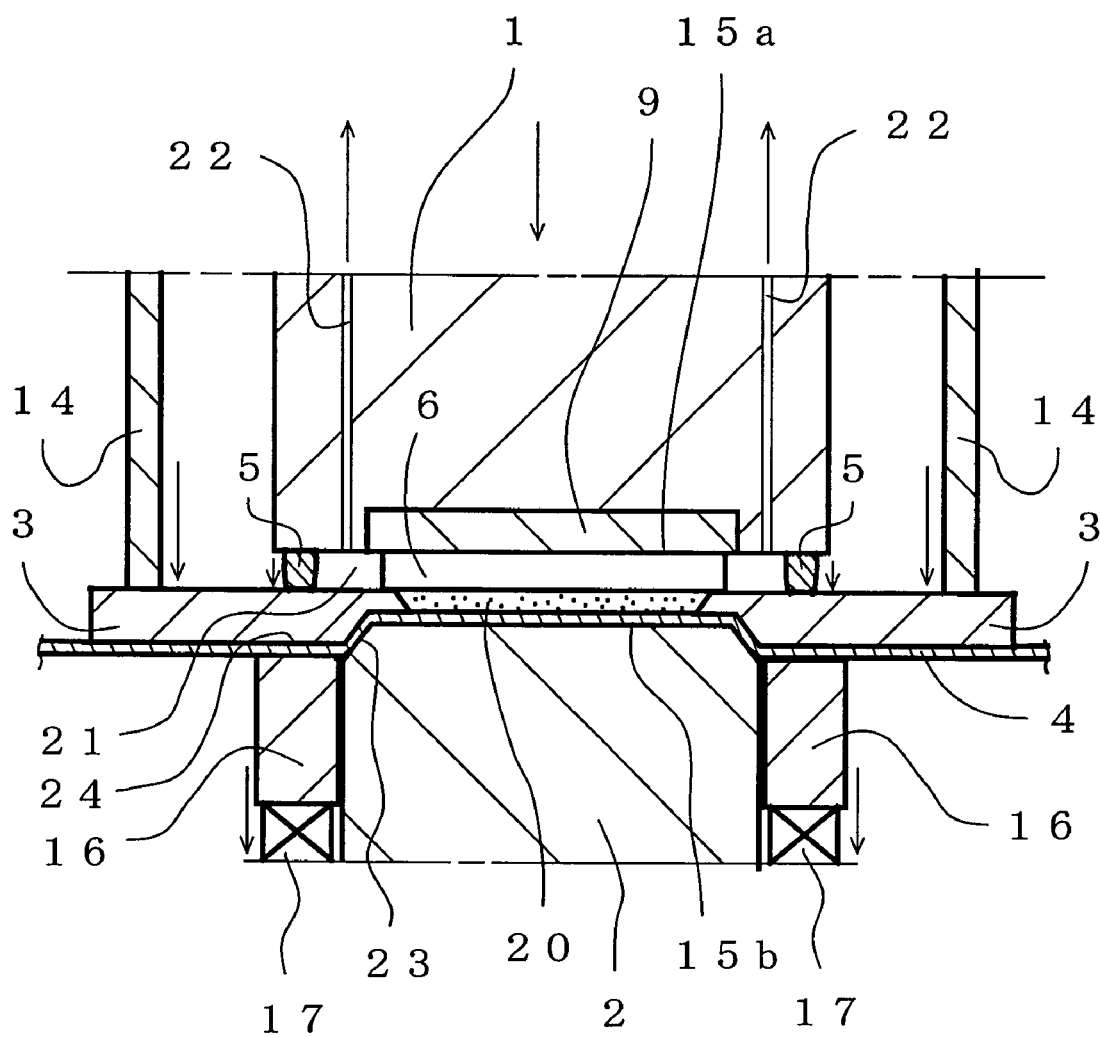
FIG. 5 is a cross-sectional view showing enlarged main part of the resin encapsulation molding apparatus of an electronic apparatus of the embodiment, in which the upper mold, the lower mold, and the intermediate plate are fully clamped.

Next, as shown in FIG. 5, semiconductor chip 7 and wire 8 are gradually brought near to molten resin 20 in cavity space 18. Thus, electronic part (semiconductor chip 7) and wire 8 are gradually buried in molten resin 20. The periphery of substrate 6 is not provided with encapsulation molding. Thus, when upper mold 1 and intermediate plate 3 are clamped, the periphery of substrate 6 abuts to the upper surface of intermediate plate 3 as shown in FIG. 5.

By finishing the above mentioned step, the clamping step is completed. At this time, molten resin 20 does not leak. Thereafter, molten resin 20 that includes the electronic part (semiconductor chip 7) and wire 8 cures. In other words, molten resin 20 changes to cured resin 10. As a result, encapsulated substrate 11 is molded.

Next, as shown in FIG. 1, in the state where semiconductor chip 7 and wire 8 of encapsulated substrate 11 are facing downward, upper mold 1 and intermediate plate 3 are mold-open. Thereafter, intermediate plate 3 and lower mold 2 are mold-open. Thus, a prescribed tension that has been applied to release film 4 sandwiched between mold surfaces 24, 13 of intermediate plate 3 and mold surfaces 15b, 23 of lower mold 2 is removed.

Further, the pressing force applied to member 16 provided to the periphery of lower mold 2 and resilient member 17 shown in FIG. 1 is removed. Release film 4 is released from lower mold 2 and intermediate plate 3. Encapsulated substrate 11 and release film 4 are separated. Further, by stopping the function of the vacuum mechanism, the evacuation is stopped.

Release film 4 after use is transported from immediately above of mold surface 15b of lower mold 2 by the release film supplying mechanism. Thus, release film 4 before use is supplied from film supplying mechanism to the above of mold surface 15b of lower mold 2. Further, as shown in FIG. 1, encapsulated substrate 11 is released from the fixing of fixing means 9 after upper mold 1, lower mold 2 and intermediate plate 3 are mold-open. Thereafter, encapsulated substrate 11 is transported to other apparatus.

Next substrate 6 before provided with encapsulation to which an electronic part (semiconductor chip 7) and wire 8 are attached is supplied to fixing means 9 of upper mold 1 and attached to a prescribed position. It should be noted that an interval may be provided between the step of clamping lower mold 2 and intermediate plate 3 and the step of clamping intermediate plate 3 and upper mold 1.

Further, a scheme may be employed where the movement of upper mold 1 is not stopped and the moving speed of upper mold 1 is made slow after the step of clamping lower mold 2 and intermediate plate 3. Still further, in the present embodiment, the resin encapsulation molding method has been described using the mold consisting of movable upper mold 1, intermediate plate 3 moving reciprocally upward and downward, and lower mold 2 of which position is fixed. However, the resin encapsulation molding method can be carried out using a mold where the position of upper mold 1 is fixed and intermediate plate 3 and lower mold 2 are movable.

Still further, in the present embodiment, the mold has been described by which the resin encapsulation molding step is carried out by closely contacting release film 4 to mold surface 15b of lower mold 2 using intermediate plate 3 and lower mold 2. However, another mold of different structure may be employed as long as it can carry out the resin encapsulation molding keeping release film 4 and mold surface 15b of lower mold 2 closely contacting to each other.

Still further, though granulated resin 19 has been employed in the present embodiment, a liquid resin or a powder resin may be employed. Still further, in the present embodiment, the example has been described where an electronic part that is wire-bonded is provided with resin encapsulation molding. However, with a flip-chip substrate to which an electronic part without wire 8 is provided, the resin encapsulation molding method can be carried out. In this case, a tablet-type resin may be employed for the resin encapsulation.

Still further, the resin encapsulation molding apparatus may have an ejector mechanism (not shown) that is capable of pushing out encapsulated substrate 11 with release film 4 interposed between them when encapsulated substrate 11 and release film 4 are separated. This ejector mechanism is preferably embedded into lower mold 2 so that it can accept redundant molten resin 20 when it is excessively supplied.

In the present embodiment, the case has been described where semiconductor chip 7 as an electronic part and wire 8 are set to the resin encapsulation mold in the state facing downward. However, similarly to other example of resin encapsulation molding apparatus in FIGS. 6 and 7, the upper and lower molds of the resin encapsulation mold may be arranged reversely as compared to the present embodiment. In this case, semiconductor chip 7 and wire 8 are set to the lower mold in a state facing upward.

Figure 6:
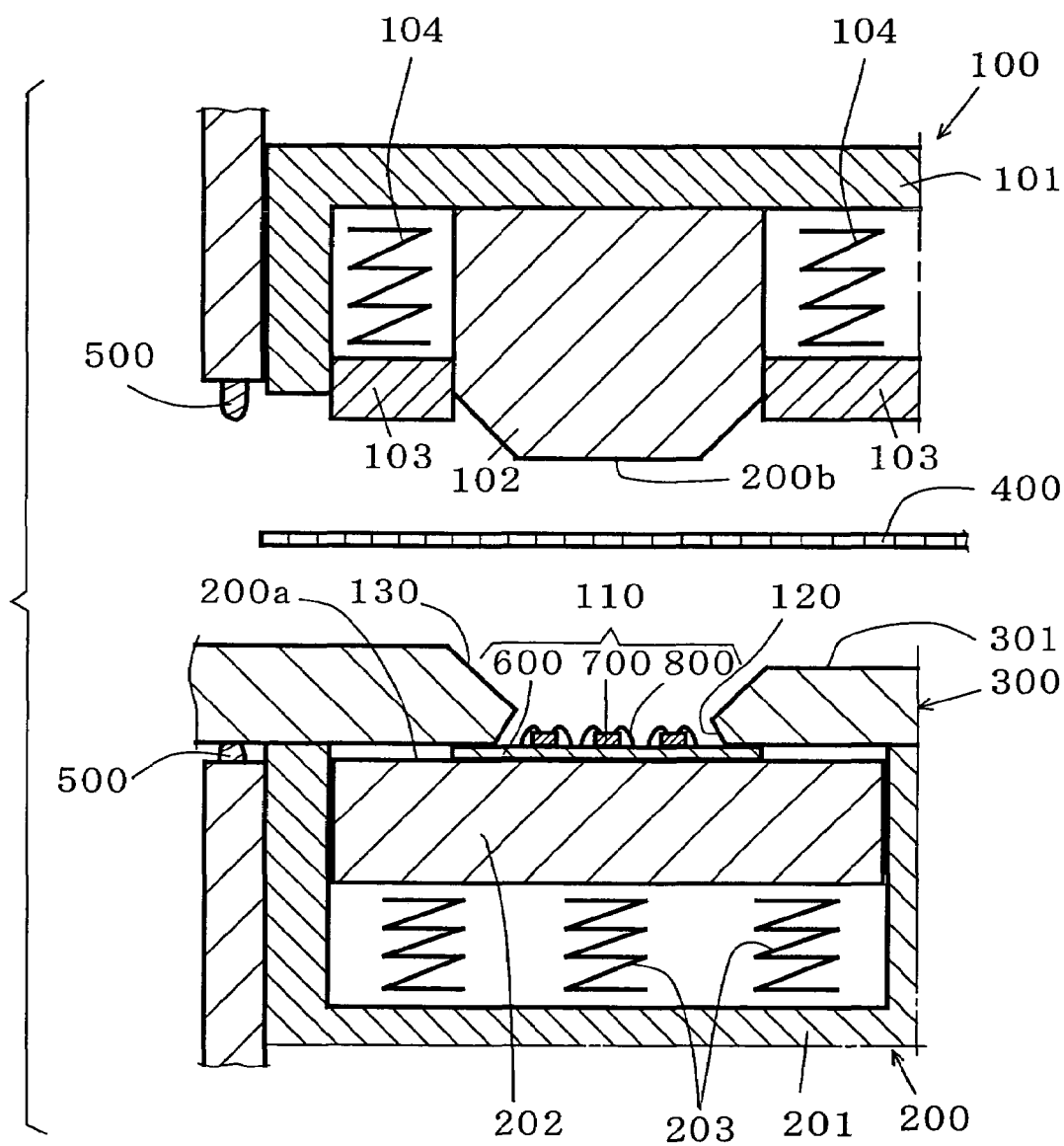
FIG. 6 is a cross-sectional view showing enlarged main part of a resin encapsulation molding apparatus of an electronic apparatus of another embodiment, in which an upper mold, a lower mold and an intermediate plate are mold-open.
Figure 7:
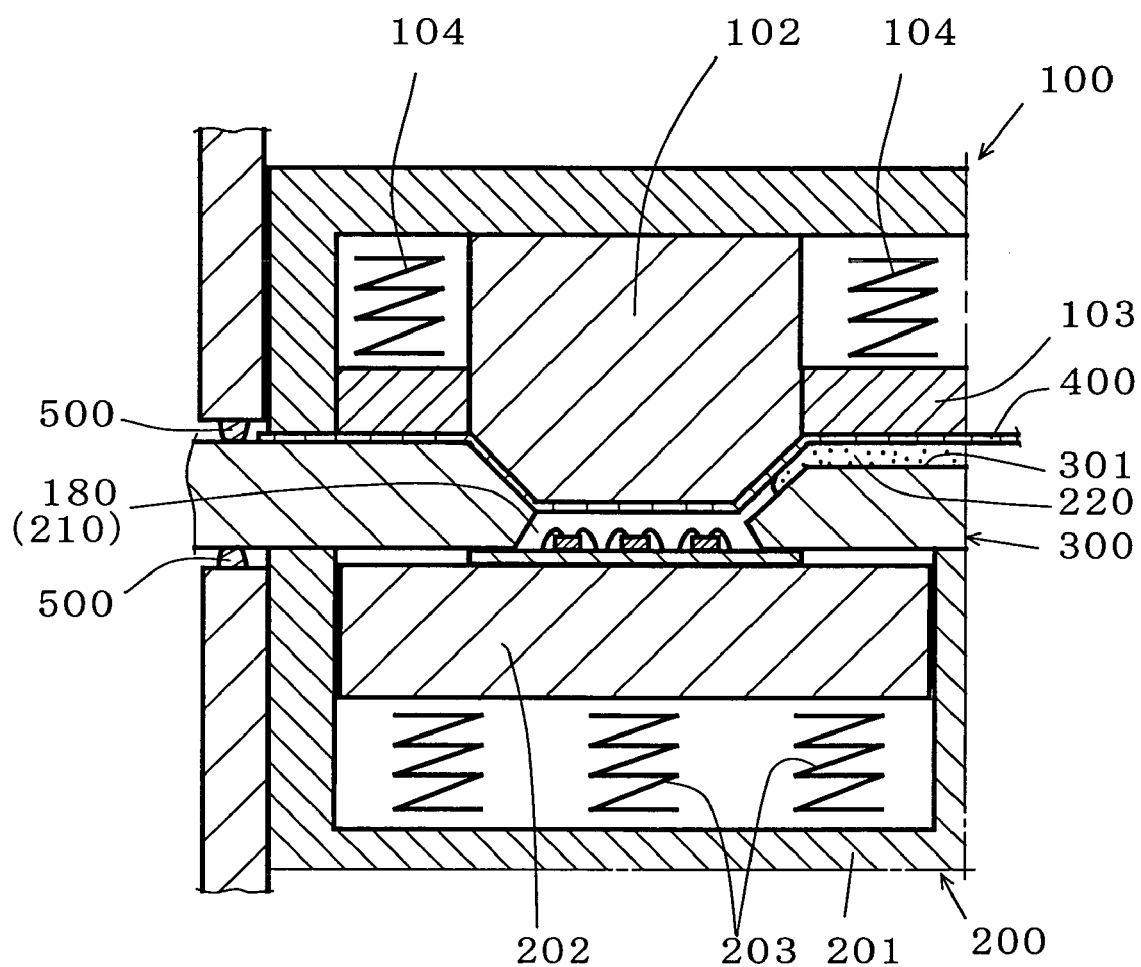
FIG. 7 is a cross-sectional view showing enlarged main part of the resin encapsulation molding apparatus of an electronic apparatus of the another embodiment, in a state of the full clamped state in which the lower mold and the intermediate plate are clamped and the upper mold and the intermediate plate are joined and vacuum is produced inside the mold.

Next, the main structure of other example of the resin encapsulation molding apparatus shown in FIGS. 6 and 7 is described.

An attachment holder 101 is removably provided to the body of upper mold 100 of the resin encapsulation molding apparatus. Attachment holder 101 is provided with an upper mold block 102, a film holding member 103 provided to surround upper mold block 102, and a resilient member 104 that enables the slidable reciprocal movement of film holding member 103 in upward and downward direction. Upper mold block 102, film holding member 103 and resilient member 104 are removably provided to attachment holder 101. At the periphery of attachment holder 101, a seal member 500 is provided to the body so as to be joined to an intermediate mold 300 when clamping of upper mold 100 and lower mold 300 are completed.

Intermediate mold 300 is provided with a cavity (a through hole) 180 that is provided to pass through intermediate mold 300 in a width direction and accommodating an electronic part (a semiconductor chip 700 and a wire 800) 110 attached to an upper surface of substrate 600 before provided with resin encapsulation. Cavity 180 has side surfaces 120, 130. When clamped, each of release film 400 applied with tension by a lower surface 200b of upper mold 100 and seal member 500 of upper mold 100 contact to the upper surface of intermediate mold 300. Additionally, a resin path 301 for injecting a resin material that is heated and molten into cavity 180 is provided to the upper surface of intermediate mold 300.

An attachment holder 201 is removably provided to the body of lower mold 200. Attachment holder 201 is provided with a sliding member 202 for resiliently supporting substrate 6 before provided with resin encapsulation to which the electronic part (semiconductor chip 700 and wire 800) are attached in a state facing upward, and a resilient member 203 for enabling reciprocal movement of sliding member 202 in upward and downward direction. Sliding member 202 and resilient member 203 are removably attached to attachment holder 201.

At the periphery of attachment holder 201, seal member 500 is joined to intermediate mold 300 when lower mold 200 and intermediate mold 300 are clamped.

Such a resin encapsulation molding apparatus shown in FIGS. 6 and 7 has substantially the same structure to the previous embodiment except for the following points:

1. The upper mold and the lower mold are positioned reversely.

2. Substrate 600 before provided with resin encapsulation is resiliently supported on the mold in the state facing upward.

3. Occurrence of a crease in release film 400 in cavity space 180 (enclosed space 210) is avoided by applying tension to release film 400 in the direction of its surface when fully clamping the mold as shown in FIG. 7, which is achieved by film holding member 103 resiliently supporting release film 400.

4. Attachment holders 101, 201 are removable from the body.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A resin encapsulation molding method for resin encapsulating an electronic part, comprising steps of:
   preparing a first mold having a first main mold surface;
   preparing a second mold having a second main mold surface opposed to said first main mold surface;
   preparing a third mold that forms a mold side surface between said first main mold surface and said second main mold surface;
   fitting an electronic part into said first mold;

closely contacting a release film to said second main mold surface by sandwiching said release film using said second mold and said third mold to apply a prescribed tension to said release film;

clamping said first mold, said second mold and said third mold to form an enclosed space that includes said electronic part by using said first main mold surface, said second main mold surface and said mold side surface;

maintaining a clamped tensioned state and position of said release film to avoid contact between said release film and said electronic part;

filling said enclosed space with a molten resin; and providing resin encapsulation molding to said electronic part by curing said molten resin.

2. The resin encapsulation molding method according to claim 1, wherein said step of clamping includes steps of:

clamping said third mold and said second mold, which effectuates said step of closely contacting said release film to said second main mold surface; and then, while maintaining said clamping of said third mold and said second mold and maintaining said contacting of said release film to said second am mold surface clamping said first mold and said third mold.

3. The resin encapsulation molding method according to claim 1, wherein in said step of closely contacting said release film to said second main mold surface by applying a prescribed tension to said release film, said release film is pressed to said third mold by a resilient force of a resilient mechanism.

4. The resin encapsulation molding method according to claim 1, further comprising evacuating said enclosed space, and wherein said step of providing said resin encapsulation molding is conducted in a state in which said enclosed space is subjected to a vacuum.

5. A resin encapsulation molding apparatus for carrying out the resin encapsulation molding method according to claim 1, said apparatus comprising means for executing each of said steps of the resin encapsulation molding method.

6. The resin encapsulation molding method according to claim 1, further comprising an additional step of holding said release film by sandwiching said release film between said third mold and a film holding member located at a side of said second mold, before and during said step of closely contacting and said step of clamping.

7. The resin encapsulation molding method according to claim 6, wherein said second mold has a protruding mold surface including said second main mold surface, said third mold has a recessed surface complementary to and mating with said protruding mold surface of said second mold, and said step of closely contacting said release film to said second main mold surface comprises sandwiching said release film between said protruding mold surface of said second mold and said recessed surface of said third mold whereby said release film is pulled and deflected out of a flat plane configuration and said prescribed tension is applied to said release film.

8. The resin encapsulation molding method according to claim 1, wherein said second mold has a protruding mold surface including said second main mold surface, said third mold has a recessed surface complementary to and mating with said protruding mold surface of said second mold, and said step of closely contacting said release film to said second main mold surface comprises sandwiching said release film between said protruding mold surface of said second mold and said recessed surface of said third mold whereby said release film is pulled and deflected out of a flat plane configuration and said prescribed tension is applied to said release film.

9. The resin encapsulation molding method according, to claim 8, wherein said protruding mold surface includes said second main mold surface and a tapering peripheral slope surface at a periphery of said second main mold surface.

* * * * *

UNITED STATES PATENT AND TRADEMARK OFFICE
CERTIFICATE OF CORRECTION

PATENT NO. : 6,977,188 B2
DATED : December 20, 2005
INVENTOR(S) : Takase

It is certified that error appears in the above-identified patent and that said Letters Patent is hereby corrected as shown below:

Column 2,
Line 39, after "cavity 35" insert -- to --;

Column 6,
Line 17, after "space" replace "23" with -- 21 --;

Column 9,
Line 24, after "second" replace "am" with -- main --;
Line 24, after "surface" insert -- , --;

Column 10,
Line 34, after "according" delete -- , --.

Signed and Sealed this

Sixteenth Day of May, 2006

JON W. DUDAS
*Director of the United States Patent and Trademark Office*